(12) United States Patent
Kashima

(10) Patent No.: US 11,665,902 B2
(45) Date of Patent: May 30, 2023

(54) SEMICONDUCTOR STORAGE DEVICE AND MANUFACTURING METHOD THEREOF

(71) Applicant: Kioxia Corporation, Tokyo (JP)

(72) Inventor: Takayuki Kashima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 134 days.

(21) Appl. No.: 17/007,871

(22) Filed: Aug. 31, 2020

(65) Prior Publication Data

US 2021/0272980 A1 Sep. 2, 2021

(30) Foreign Application Priority Data

Feb. 28, 2020 (JP) .............................. JP2020-034068

(51) Int. Cl.
| | |
|---|---|
| *H01L 27/00* | (2006.01) |
| *H01L 27/11582* | (2017.01) |
| *H01L 27/11565* | (2017.01) |
| *H01L 21/308* | (2006.01) |
| *H01L 21/306* | (2006.01) |
| *H01L 21/3213* | (2006.01) |

(52) U.S. Cl.
CPC .. *H01L 27/11582* (2013.01); *H01L 27/11565* (2013.01); *H01L 21/3083* (2013.01); *H01L 21/30604* (2013.01); *H01L 21/32136* (2013.01); *H01L 21/32139* (2013.01)

(58) Field of Classification Search
CPC ......... H01L 27/11565; H01L 27/11578; H01L 27/11568; H01L 27/1157
See application file for complete search history.

(56) References Cited

U.S. PATENT DOCUMENTS

| | | |
|---|---|---|
| 10,566,348 B1 | 2/2020 | Yeh et al. |
| 2019/0296031 A1 | 9/2019 | Murata et al. |
| 2019/0296117 A1* | 9/2019 | Ishiduki ............... H01L 29/7926 |
| 2019/0371811 A1* | 12/2019 | Oike .................. H01L 27/11582 |

FOREIGN PATENT DOCUMENTS

| | | |
|---|---|---|
| TW | I670838 B | 9/2019 |
| TW | 201941403 A | 10/2019 |

* cited by examiner

*Primary Examiner* — Reema Patel
(74) *Attorney, Agent, or Firm* — Foley & Lardner LLP

(57) ABSTRACT

A semiconductor storage device includes a substrate. A stacked body is disposed above the substrate and has an alternately stacked plurality of first insulating layers and plurality of conductive layers. A plurality of columnar portions penetrate the stacked body and include a core layer disposed at a center portion of the columnar portions, a semiconductor layer provided around the core layer, and a memory film disposed around the semiconductor layer. A slit divides an upper conductive layer at an upper portion of the stacked body. In a columnar portion overlapping the slit, the core layer or the memory film protrudes from the semiconductor layer.

7 Claims, 18 Drawing Sheets

SEMICONDUCTOR STORAGE DEVICE AND MANUFACTURING METHOD THEREOF

CROSS-REFERENCE TO RELATED APPLICATION

This application is based upon and claims the benefit of priority from Japanese Patent Application No. 2020-034068, filed Feb. 28, 2020, the entire contents of which are incorporated herein by reference.

FIELD

Embodiments described herein relate generally to a semiconductor storage device and a manufacturing method thereof.

BACKGROUND

In recent years, a semiconductor storage device including a three-dimensional memory cell array in which memory cells are three-dimensionally arranged is developed. In such a semiconductor storage device, a slit is provided on an upper portion of the memory cell array in order to divide a select gate.

The slit is formed in a stacked film of an insulating layer and a conductive layer and a columnar portion in a memory hole. Material such as a metal material, however, which is difficult to control etching, is used for the conductive layer and the columnar portion. Therefore, when it is attempted to widen a width at a bottom portion of the slit in order to sufficiently and electrically isolate the adjacent select gates, an upper opening of the slit becomes too wide, and a depth of the slit becomes too deep. This impairs miniaturization of the memory cell array. Further, poor etching controllability causes fluctuation in the depth of the slit in the conductive layer and the columnar portion.

Since the conductive layer and the columnar portion have the poor etching controllability, an inner wall of the slit has a taper, and the bottom portion of the slit is tapered. In order to properly divide the select gate at the bottom portion of the tapered slit, it is required to deepen the slit and widen the width at the bottom portion of the slit to some extent. As described above, the taper shape of the slit also causes the slit to become deep. When the slit is deep, it is required to prepare a large number of conductive layers to be dummy (dummy word lines) in a stacked body. This further impairs miniaturization of the memory cell array.

DETAILED DESCRIPTION

At least one embodiment provides a semiconductor storage device in which a plurality of select gates at an upper portion of a memory cell array are surely divided and the size of the memory cell array is reduced, and a manufacturing method thereof.

In general, according to at least one embodiment, a semiconductor storage device includes a substrate. A stacked body is disposed above the substrate. The staked body has a plurality of first insulating layers and a plurality of conductive layers which are alternately stacked. A plurality of columnar portions penetrate the stacked body and include: a core layer provided at a center portion of the columnar portions, a semiconductor layer disposed around the core layer, and a memory film provided around the semiconductor layer. A slit divides an upper conductive layer at an upper portion of the stacked body. In a columnar portion overlapping the slit, the core layer or the memory film protrudes from the semiconductor layer.

Hereinafter, at least one embodiment according to the present disclosure will be described with reference to the drawings. The at least one embodiment does not limit the present disclosure. In the following embodiments, a vertical direction of a semiconductor substrate indicates a relative direction when a surface on which a semiconductor element is provided is defined as UP, and may be different from a vertical direction according to acceleration of gravity. The drawings are schematic or conceptual, and a proportion of each portion is not necessarily the same as that of the actual one. In the specification and drawings, the same elements as those described above with reference to the already illustrated drawings will be denoted by the same reference signs, and detailed description thereof will be appropriately omitted.

First Embodiment

Figure 1A:
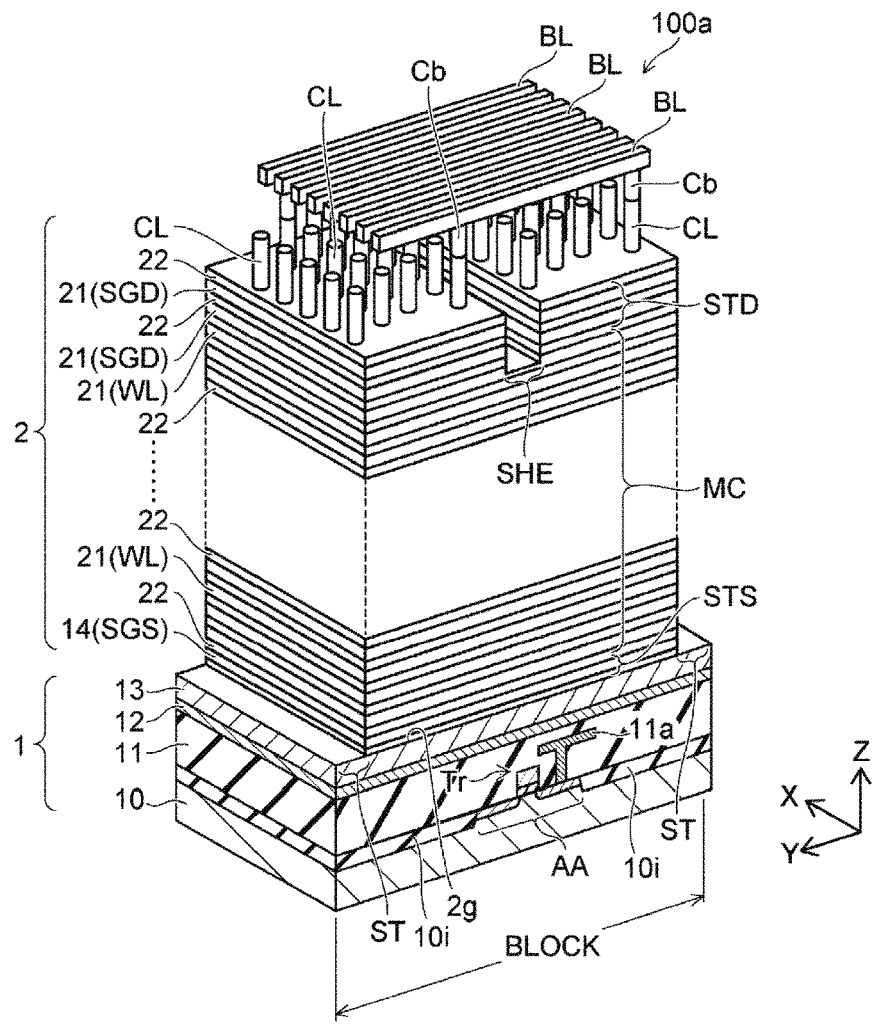
FIG. 1A is a schematic perspective view illustrating a semiconductor storage device according to a first embodiment.
Figure 1B:
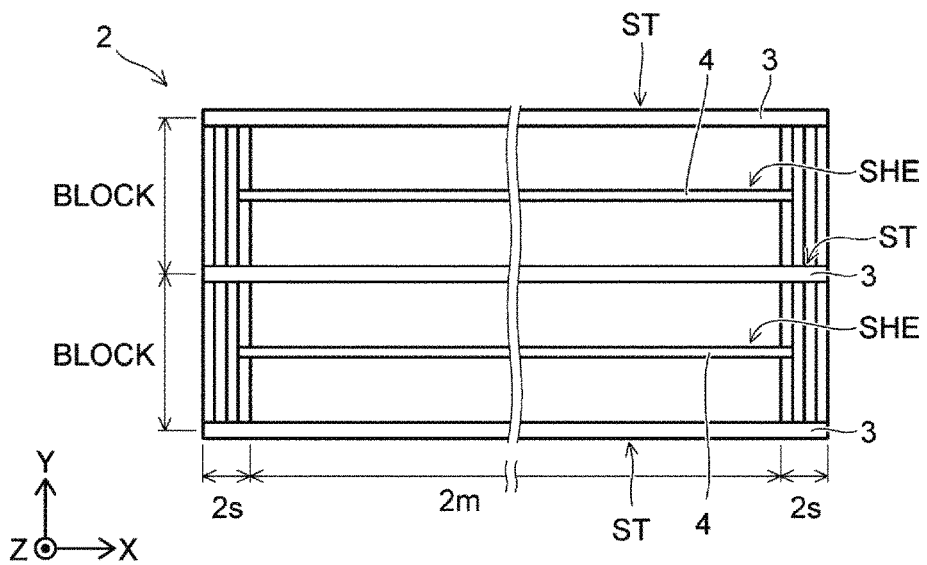
FIG. 1B is a schematic plan view illustrating a stacked body according to at least one embodiment.
Figure 2A:
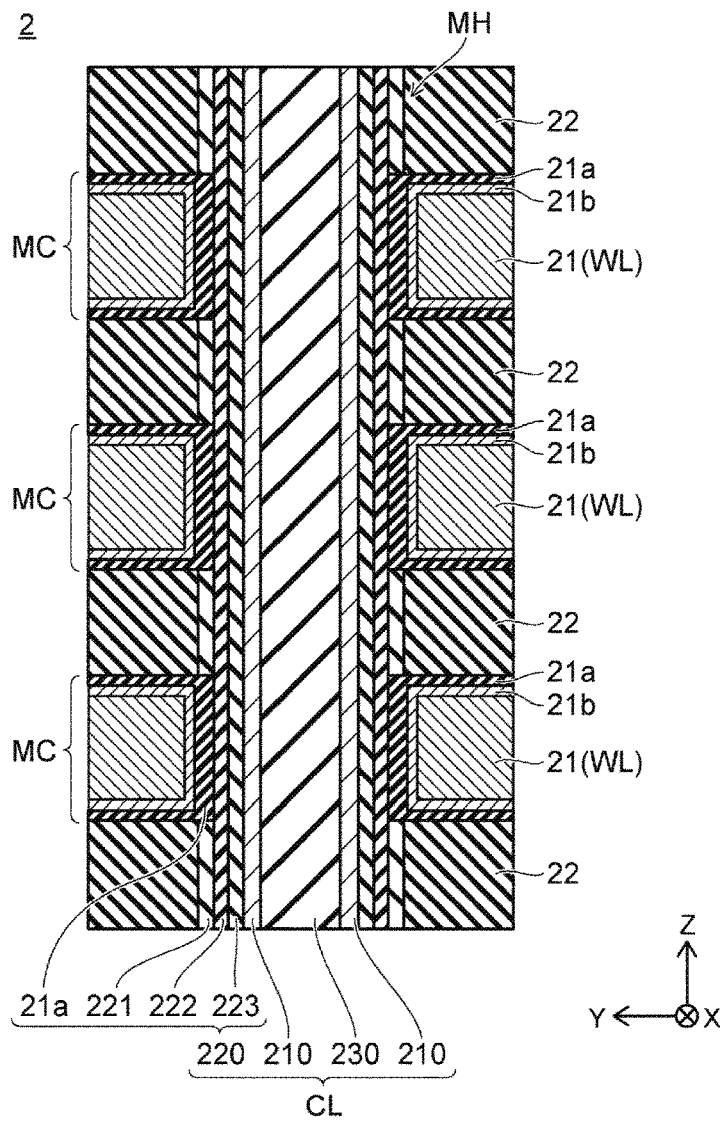
FIG. 2A is a schematic cross-sectional view illustrating a memory cell of a three-dimensional structure according to at least one embodiment.
Figure 2B:
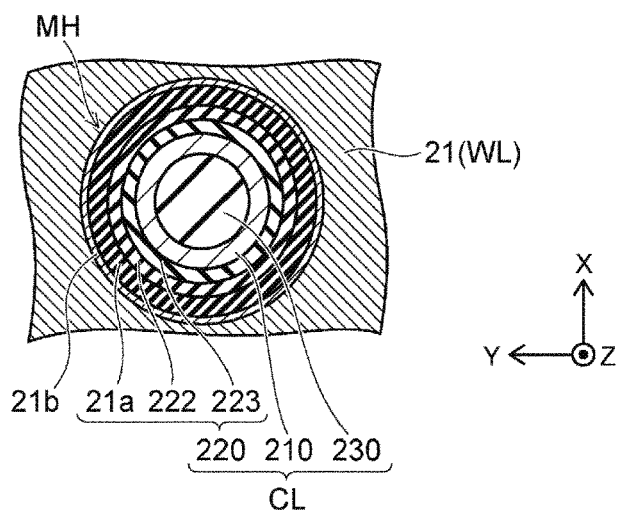
FIG. 2B is a schematic cross-sectional view illustrating the memory cell of the three-dimensional structure according to at least one embodiment.
Figure 3:
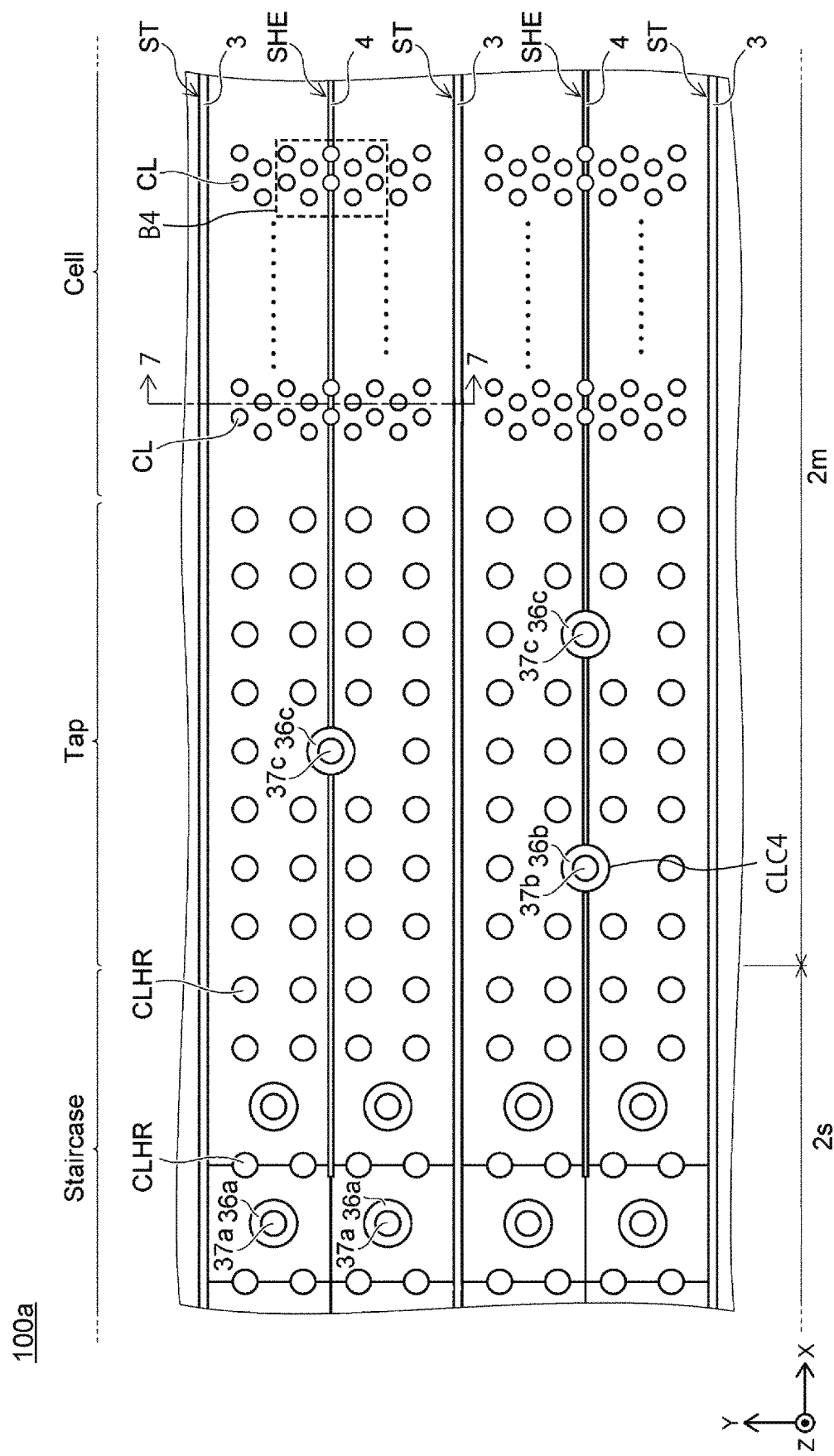
FIG. 3 is a schematic plan view illustrating the semiconductor storage device according to the first embodiment.

FIG. 1A is a schematic perspective view illustrating a semiconductor storage device 100a according to a first embodiment. FIG. 1B is a schematic plan view illustrating a stacked body 2. In the specification, a stacking direction of the stacked body 2 is defined as a Z direction. One direction that intersects the Z direction, and for example, that is orthogonal thereto is defined as a Y direction. One direction that intersects each of the Z and Y directions, and for example, that is orthogonal thereto is defined as an X direction. FIGS. 2A and 2B are schematic cross-sectional views respectively illustrating a memory cell of a three-dimensional structure. FIG. 3 is a schematic plan view illustrating the semiconductor storage device 100a according to the first embodiment.

As illustrated in FIGS. 1A to 3, the semiconductor storage device 100a according to the first embodiment is a nonvolatile memory including the memory cell of the three-dimensional structure.

The semiconductor storage device 100a includes a base body portion 1, the stacked body 2, a deep slit ST (plate-shaped portion 3), a shallow slit SHE, and a plurality of columnar portions CL.

The base body portion 1 includes a substrate 10, an insulating film 11, a conductive film 12, and a semiconductor portion 13. The insulating film 11 may be provided on the substrate 10. The conductive film 12 is provided on the insulating film 11. The semiconductor portion 13 is provided on the conductive film 12. The substrate 10 is a semiconductor substrate, for example, a silicon substrate. A conductivity type of silicon (Si) is, for example, a p-type. For example, an element isolation area 10i is provided in a front surface area of the substrate 10. The element isolation area 10i is, for example, an insulating area containing a silicon oxide, and partitions an active area AA in the front surface area of the substrate 10. A source area and a drain area of a transistor Tr are provided in the active area AA. The transistor Tr forms a peripheral circuit (a complementary metal oxide semiconductor (CMOS) circuit) of the nonvolatile memory. The insulating film 11 contains, for example, silicon oxide ($SiO_2$), and insulates the transistor Tr. A wiring 11a is provided in the insulating film 11. The wiring 11a is a wiring electrically connected to the transistor Tr. The conductive film 12 contains a conductive metal such as tungsten (W). The semiconductor portion 13 contains, for example, silicon. A conductivity type of silicon is, for example, n-type. Apart of the semiconductor portion 13 may contain undoped silicon.

The stacked body 2 is provided above the substrate 10 and is located in the Z direction with respect to the semiconductor portion 13. The stacked body 2 is configured such that a plurality of conductive layers 21 and a plurality of insulating layers 22 are alternately stacked along the Z direction. The conductive layer 21 contains a conductive metal such as tungsten. For example, the insulating layer 22 contains a silicon oxide. The insulating layer 22 insulates the conductive layers 21 from each other. The number of layers of each of the conductive layer 21 and the insulating layer 22 is freely selected. The insulating layer 22 may be, for example, an air gap. For example, an insulating film 2g is provided between the stacked body 2 and the semiconductor portion 13. The insulating film 2g contains, for example, silicon oxide ($SiO_2$). The insulating film 2g may include a high dielectric having a relative dielectric constant higher than that of the silicon oxide. The high dielectric is, for example, a metal oxide.

The conductive layer 21 includes at least one source-side select gate SGS, a plurality of word lines WL, and at least one drain-side select gate SGD. The source-side select gate SGS is a gate electrode of a source-side select transistor STS. The word line WL is a gate electrode of a memory cell MC. The drain-side select gate SGD is a gate electrode of a drain-side select transistor STD. The source-side select gate SGS is provided in a lower area of the stacked body 2. The drain-side select gate SGD is provided in an upper area of the stacked body 2. The lower area refers to an area of the stacked body 2 on the side closer to the base body portion 1, and the upper area refers to an area of the stacked body 2 on the side farther from the base body portion 1. The word line WL is provided between the source-side select gate SGS and the drain-side select gate SGD.

Among the plurality of insulating layers 22, a thickness in the Z direction of the insulating layer 22 that insulates the source-side select gate SGS and the word line WL may be thicker than, for example, a thickness in the Z direction of the insulating layer 22 that insulates the word line WL and the word line WL. A cover insulating film (not illustrated) may be provided on top of the insulating layer 22 that is farthest from the base body portion 1. The cover insulating film contains, for example, a silicon oxide.

The semiconductor storage device 100a includes a plurality of memory cells MC connected in series between the source-side select transistor STS and the drain-side select transistor STD. A structure in which the source-side select transistor STS, the memory cell MC, and the drain-side select transistor STD are connected in series is referred to as a "memory string" or a "NAND string". For example, the memory string is connected to a bit line BL via a contact Cb. The bit line BL is provided above the stacked body 2 and extends in the Y direction.

A plurality of deep slits ST and a plurality of shallow slits SHE are respectively provided in the stacked body 2. The deep slit ST extends in the X direction and is provided in the stacked body 2 while penetrating the stacked body 2 from an upper end of the stacked body 2 to the base body portion 1. The plate-shaped portion 3 is provided in the deep slit ST (FIG. 1B). The plate-shaped portion 3 includes, for example, at least an insulator. This insulator is, for example, a silicon oxide. The plate-shaped portion 3 may include a conductive material that is electrically connected to the semiconductor portion 13 while being electrically insulated from the stacked body 2 by an insulating material. The shallow slit SHE extends in the X direction and is provided from the upper end of the stacked body 2 to the middle of the stacked body 2. For example, an insulator 4 is provided in the shallow slit SHE (FIG. 1B). The insulator 4 is, for example, a silicon oxide.

As illustrated in FIG. 1B, the stacked body 2 includes a staircase portion 2s and a memory cell array 2m. The staircase portion 2s is provided at an edge portion of the stacked body 2. The memory cell array 2m is interposed between the staircase portions 2s or is surrounded by the staircase portions 2s. The deep slit ST is provided from the staircase portion 2s at one end of the stacked body 2 to the staircase portion 2s at the other end of the stacked body 2 via the memory cell array 2m. The shallow slit SHE is provided at least in the memory cell array 2m.

As illustrated in FIG. 3, the memory cell array 2m includes a cell area (Cell) and a tap area (Tap). The staircase portion 2s includes a staircase area (Staircase) (FIG. 3). The tap area is provided, for example, between the cell area and the staircase area. Although not illustrated in FIG. 3, the tap area may be provided between the cell areas. The staircase area is an area where a plurality of wirings 37a are provided. The tap area is an area where wirings 37b and 37c are provided. Each of the wirings 37a to 37c extends, for example, in the Z direction. Each of the wirings 37a is electrically connected to, for example, the conductive layer 21. The wiring 37b is electrically connected to, for example, the conductive film 12. The wiring 37c is electrically connected to, for example, the wiring 11a.

A portion of the stacked body 2 interposed between the two plate-shaped portions 3 illustrated in FIG. 1B is referred to as a block (BLOCK). The block forms, for example, a minimum unit of data erasing. The insulator 4 is provided in the block. The stacked body 2 between the plate-shaped portion 3 and the insulator 4 is referred to as a finger. The drain-side select gate SGD is divided for each finger. Therefore, at the time of writing and reading data, one finger in the block can go into a selected state by the drain-side select gate SGD.

Each of the plurality of columnar portions CL is provided in a memory hole MH provided in the stacked body 2. Each columnar portion CL passes through the stacked body 2 from the upper end of the stacked body 2 along the Z direction, and is provided in the stacked body 2 and the semiconductor portion 13. Each of the plurality of columnar portions CL includes a semiconductor body 210, a memory film 220, and a core layer 230. The columnar portion CL includes the core layer 230 provided at a center portion thereof; the semiconductor body 210 provided around the core layer 230; and the memory film 220 provided around the semiconductor body 210. The semiconductor body 210 is electrically connected to the semiconductor portion 13. The memory film 220 includes a charge trapping portion between the semiconductor body 210 and the conductive layer 21. The plurality of columnar portions CL selected one by one from each finger are commonly connected to one bit line BL via the contact Cb. Each of the columnar portions CL is provided in, for example, the cell area (Cell) (FIG. 3).

As illustrated in FIGS. 2A and 2B, a shape of the memory hole MH on the XY plane is, for example, a circle or an ellipse. A block insulating film 21a forming a part of the memory film 220 may be provided between the conductive layer 21 and the insulating layer 22. The block insulating film 21a may be, for example, a silicon oxide film or a metal oxide film. One example of a metal oxide is aluminum oxide. A barrier film 21b may be provided between the conductive layer 21 and the insulating layer 22 and between the conductive layer 21 and the memory film 220. For example, when the conductive layer 21 is tungsten, a stacked structure film of a titanium nitride and titanium is selected as the barrier film 21b. The block insulating film 21a prevents back tunneling of charges from the conductive layer 21 to the side of the memory film 220. The barrier film 21b improves adhesion between the conductive layer 21 and the block insulating film 21a.

A shape of the semiconductor body 210 may be, for example, a cylindrical shape having a bottom. The semiconductor body 210 contains, for example, silicon. Silicon is, for example, polysilicon obtained by crystallizing amorphous silicon. The semiconductor body 210 is, for example, undoped silicon. The semiconductor body 210 may also be p-type silicon. The semiconductor body 210 becomes respective channels of the drain-side select transistor STD, the memory cell MC, and the source-side select transistor STS.

In the memory film 220, portions other than the block insulating film 21a are provided between an inner wall of the memory hole MH and the semiconductor body 210. The memory film 220 has, for example, a cylindrical shape. A plurality of memory cells MC have a storage area between the semiconductor body 210 and the conductive layer 21 serving as the word line WL, and are stacked in the Z direction. The memory film 220 may include, for example, a cover insulating film 221, a charge trapping film 222, and a tunnel insulating film 223. Each of the semiconductor body 210, the charge trapping film 222, and the tunnel insulating film 223 extends in the Z direction.

The cover insulating film 221 is provided between the insulating layer 22 and the charge trapping film 222. The cover insulating film 221 contains, for example, a silicon oxide. The cover insulating film 221 protects the charge trapping film 222 from being etched when replacing a sacrificial film (not illustrated) with the conductive layer 21 (a replacement process). The cover insulating film 221 may be removed from between the conductive layer 21 and the memory film 220 in the replacement process. In this case, as illustrated in FIGS. 2A and 2B, for example, the block insulating film 21a is provided between the conductive layer 21 and the charge trapping film 222. When the replacement process is not used for forming the conductive layer 21, the cover insulating film 221 may be omitted.

The charge trapping film 222 is provided between the block insulating film 21a, the cover insulating film 221, and the tunnel insulating film 223. The charge trapping film 222 contains, for example, a silicon nitride, and has a trap site for trapping charges in the film. A portion of the charge trapping film 222 interposed between the conductive layer 21 that becomes the word line WL and the semiconductor body 210 forms a storage area of the memory cell MC as a charge trapping portion. A threshold voltage of the memory cell MC changes depending on the presence or absence of charges in the charge trapping portion or an amount of charges trapped in the charge trapping portion. Accordingly, the memory cell MC stores information.

The tunnel insulating film 223 is provided between the semiconductor body 210 and the charge trapping film 222. The tunnel insulating film 223 contains, for example, a silicon oxide, or a silicon oxide and a silicon nitride. The tunnel insulating film 223 is a potential barrier between the semiconductor body 210 and the charge trapping film 222. For example, when injecting an electron from the semiconductor body 210 into the charge trapping portion (a write operation), and when injecting a hole from the semiconductor body 210 into the charge trapping portion (an erasing operation), the electron and the hole respectively pass through (tunnel) the potential barrier of the tunnel insulating film 223.

The core layer 230 embeds an internal space of the cylindrical semiconductor body 210. For example, the core layer 230 has a columnar shape. The core layer 230 contains, for example, a silicon oxide, and has insulation properties.

Each of the plurality of columnar portions CLHR in FIG. 3 is provided in a hole HR provided in the stacked body 2. The hole HR penetrates the stacked body 2 from the upper end of the stacked body 2 along the Z direction, and is provided in the stacked body 2 and the semiconductor portion 13. Each of the columnar portions CLHR includes at least an insulator 5. The insulator 5 is, for example, a silicon oxide. Each of the columnar portions CLHR may have the same structure as that of the columnar portion CL. Each of the columnar portions CLHR may be provided in, for example, the staircase area (Staircase) and the tap area (Tap). The columnar portion CLHR functions as a support member for storing a gap formed in the staircase area and the tap area when the sacrificial film (not illustrated) is replaced with the conductive layer 21 (the replacement process). A plurality of columnar portions CLC4 are formed in the tap area (Tap) of the stacked body 2, an insulating film 32, and an insulating film 31. Each of the columnar portions CLC4 includes the wiring 37c. The wiring 37c is electrically insulated from the stacked body 2 by an insulator 36c. The wiring 37c is electrically connected to any one of the wiring 11a, and the like.

Figure 4:
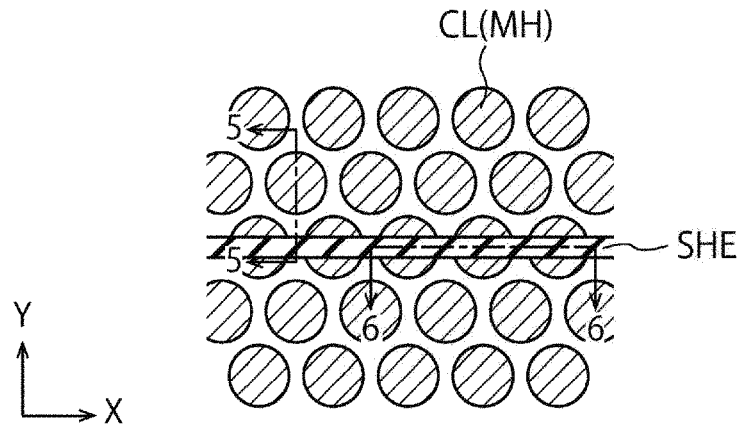
FIG. 4 is a plan view illustrating a configuration of a frame B4 in FIG. 3 in more detail according to at least one embodiment.

The columnar portion CL, that is, the memory hole MH is arranged, in a planar layout, between two slits ST adjacent to each other in the Y direction in a hexagonal closest packing manner. As illustrated in FIG. 4, the shallow slit SHE overlaps a part of the columnar portion CL. The columnar portion CL below the shallow slit SHE does not form the memory cell.

The semiconductor portion 13 of FIG. 1A includes, for example, an n-type semiconductor layer 131, an n-type semiconductor layer 132, and an n-type or undoped semiconductor layer 133. The semiconductor layer 131 contacts the conductive film 12. The semiconductor layer 132 respectively contacts the semiconductor layer 131 and the semiconductor body 210. For example, the semiconductor layer 132 extends to a portion where the memory film 220 is removed, and contacts the semiconductor body 210. The semiconductor layer 132 surrounds the semiconductor body 210 on the X-Y plane. The semiconductor layer 133 contacts the semiconductor layer 132.

The semiconductor storage device 100a further includes a semiconductor portion 14. The semiconductor portion 14 is located between the stacked body 2 and the semiconductor portion 13. The semiconductor portion 14 includes a semiconductor layer 134. The semiconductor layer 134 is provided between an insulating layer 22b of the insulating layer 22 which is closest to the semiconductor portion 13 and the insulating film 2g. A conductivity type of the semiconductor layer 134 is, for example, an n-type. The semiconductor layer 134 functions as, for example, the source-side select gate SGS.

FIG. 4 is a plan view illustrating an arrangement of a frame B4 in FIG. 3 in more detail. FIG. 4 illustrates an arrangement relationship between the columnar portion CL (that is, the memory hole MH) and the shallow slit SHE. The columnar portions CL are formed in, for example, a hexagonal closest packing manner. The shallow slit SHE extends in the X direction, and overlaps one row of the columnar portions CL arranged in the X direction.

Figure 5:
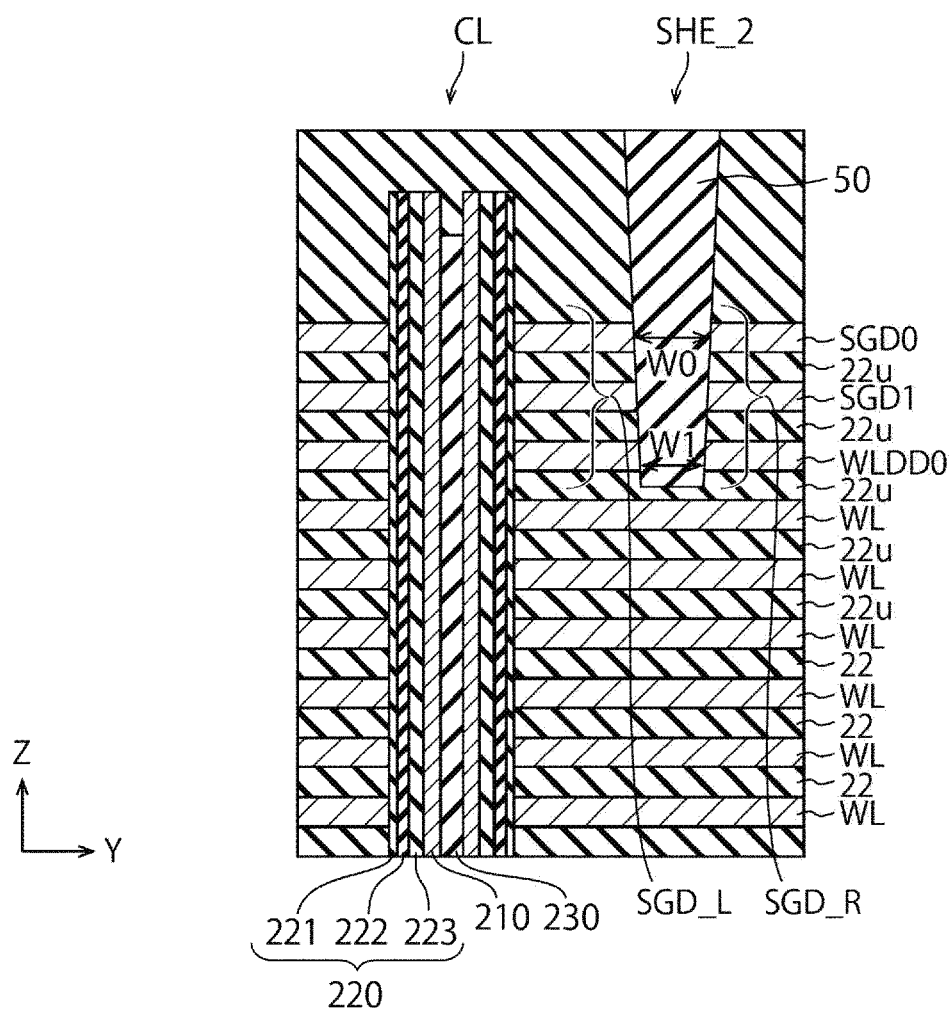
FIG. 5 is a cross-sectional view taken along the line 5-5 of FIG. 4 according to at least one embodiment.
Figure 6:
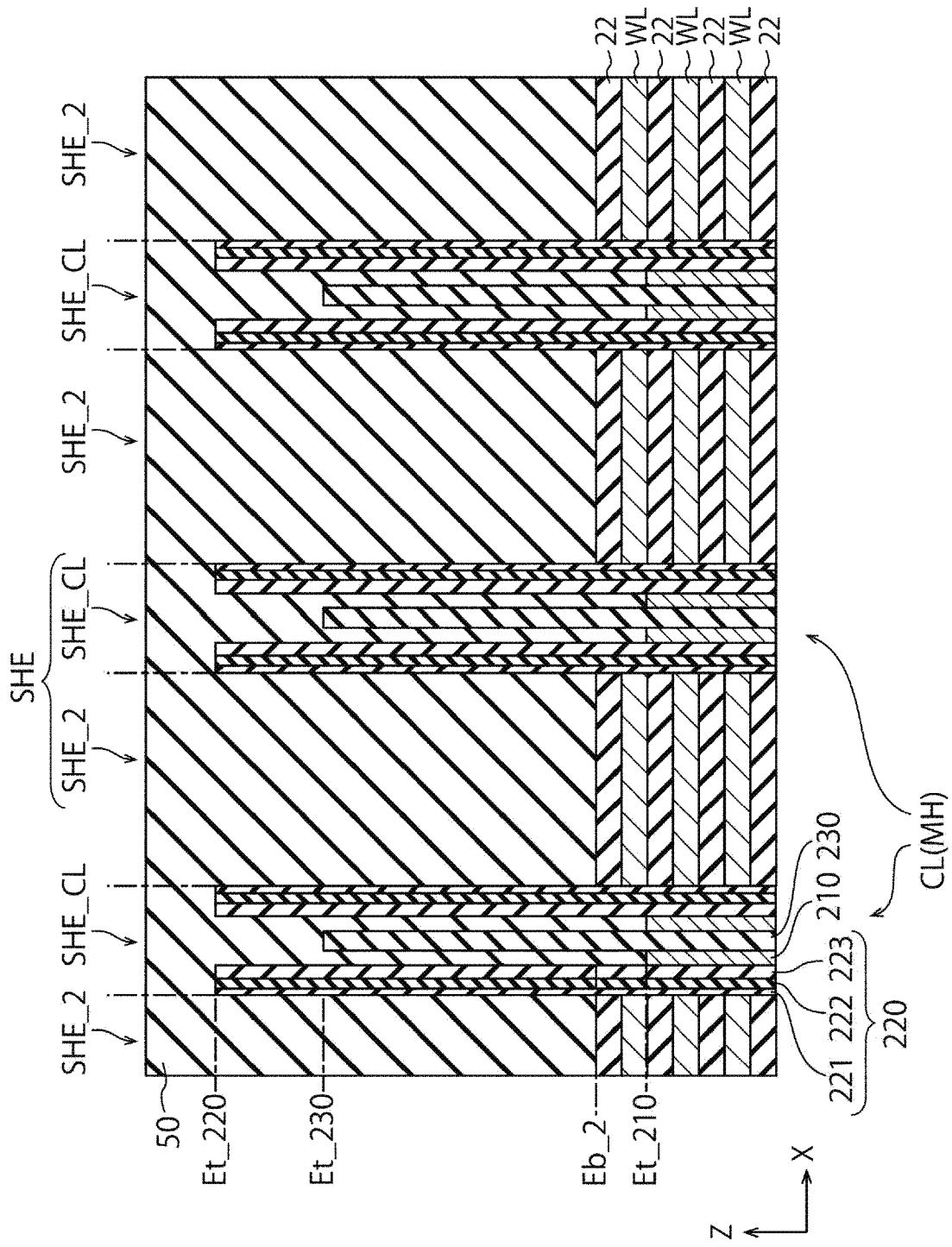
FIG. 6 is a cross-sectional view taken along the line 6-6 of FIG. 4 according to at least one embodiment.

FIG. 5 is a cross-sectional view taken along the line 5-5 of FIG. 4. FIG. 6 is a cross-sectional view taken along the line 6-6 of FIG. 4. A basic configuration of the columnar portion CL is as illustrated with reference to FIGS. 2A and 2B.

As illustrated in FIG. 5, the slit SHE is provided in the stacking direction (Z direction) of the stacked body 2, and penetrates upper conductive layers (SGD0, SGD1, and WLDD0) and an upper insulating layer (22u) that are located at the upper portion of the stacked body 2. Among the upper conductive layers (SGD0, SGD1, and WLDD0), SGD0 and SGD1 are the drain-side select gates. In at least one embodiment, the upper five layers among the conductive layers 21 of the stacked body 2 function as the drain-side select gates SGD0 and SGD1. WLDD0 is a dummy word line. The dummy word line WLDD0 has the same configuration as that of the word line of the memory cell array, but does not function as the word line and is provided as an etching area of the slit SHE. Therefore, etching of a groove of the slit SHE is controlled so as to stop at any location of the dummy word line WLDD0. In at least one embodiment, four layers directly under the drain-side select gates SGD0 and SGD1 among the conductive layers 21 of the stacked body 2 are provided as the dummy word line WLDD0. The slit SHE is provided up to the dummy word line WLDD0. Accordingly, the slit SHE also penetrates the upper insulating layer 22u located between the upper conductive layers (SGD0, SGD1, and WLDD0). The number of drain-side select gates and the number of dummy word lines are not particularly limited.

As illustrated in FIGS. 3 and 4, the slit SHE is continuously provided in the X direction, and divides each of the drain-side select gates SGD0 and SGD1 in the Y direction. The drain-side select gates SGD0 and SGD1 on one side divided by the slit SHE and the drain-side select gates SGD0 and SGD1 on the other side respectively correspond to different fingers. For example, the drain-side select gates SGD0 and SGD1 on the right side of the slit SHE (hereinafter, also collectively referred to as SGD_R) correspond to a plurality of columnar portions on the right side of the slit SHE (not illustrated), and can select this finger. That is, when the drain-side select transistor corresponding to the drain-side select gate SGD_R goes into an ON state, a finger FNG corresponding thereto is selected. The columnar portion CL of the selected finger FNG is connected to the bit line BL. The drain-side select gates SGD0 and SGD1 on the left side of the slit SHE (hereinafter collectively referred to as SGD_L) correspond to a plurality of columnar portions CL on the left side of the slit SHE, and select this finger. That is, when the drain-side select transistor corresponding to the drain-side select gate SGD_L goes into an ON state, a finger FNG corresponding thereto is selected. The columnar portion CL of the selected finger FNG is connected to the bit line BL. The columnar portion CL in FIG. 5 is selected by the drain-side select gate SGD_L.

It is desirable that the slit SHE divides each of the drain-side select gates SGD0 and SGD1 by a wide width to some extent so that the drain-side select gate SGD_R and the drain-side select gate SGD_L, which are adjacent to each other in the Y direction, do not affect each other due to capacitive coupling. That is, it is desirable that a distance between the drain-side select gate SGD_R and the drain-side select gate SGD_L is set to be wide to some extent.

For example, however, a metal material that is difficult to be etched such as tungsten is used for the drain-side select gates SGD0 and SGD1 and the dummy word line WLDD0. Therefore, an etching process for forming the groove of the slit SHE takes a long time, and the inner wall of the slit SHE is formed in a tapered shape. As a result, the width of the slit SHE is wider at the upper portion, and becomes narrower as the slit SHE gets closer to the bottom portion from the upper portion.

Since the inner wall of the slit SHE is formed in the tapered shape, a width W0 at the upper portion of the slit SHE is relatively wide, and a width W1 at the bottom portion thereof becomes narrow. Therefore, even though the drain-side select gate SGD0 at the upper portion is sufficiently and widely isolated by the slit SHE, an isolation width of the drain-side select gate SGD1 at the lower portion may not be sufficient. In order to address this problem, when over-etching is performed to widen a division width at the bottom portion of the slit SHE, an upper opening of the groove of the slit SHE becomes too wide, and thus a layout area of the slit SHE becomes large. What is described above is contrary to the miniaturization of the memory cell array 2m. When the groove of the slit SHE is over-etched, a depth of the groove of the slit SHE becomes too deep, and it may be required to increase the number of layers of the dummy word lines. Increasing the number of layers thereof is contrary to miniaturization of the memory cell array 2m.

As illustrated in FIG. 4, when viewed from the stacking direction (Z direction) of the stacked body 2, the slits SHE are formed to overlap each other on the stacked body 2 and the columnar portion CL (the memory hole MH). For example, when the groove of the slit SHE on the stacked body 2 and the groove of the slit SHE on the columnar portion CL are simultaneously formed by using anisotropic etching such as a reactive ion etching (RIE) method, the depth of the slit SHE varies depending on a difference in material between the stacked body 2 and the columnar portion CL. The fluctuation in the depth of the slit SHE also causes an increase in the number of layers of the dummy word lines.

Therefore, in at least one embodiment, a process of forming the slit SHE is divided into an etching process of the stacked body 2 (a first etching process) and an etching process of the columnar portion CL (a second etching process). Hereinafter, as illustrated in FIG. 6, for convenience, the slit formed in the stacked body 2 is referred to as SHE_2, and the slit formed in the columnar portion CL is referred to as SHE_CL.

In the first etching process of the stacked body 2, a groove of the slit SHE_2 is selectively formed in the stacked body 2 by using the RIE method, and in the second etching process of the columnar portion CL, the semiconductor body 210 of the columnar portion CL is selectively etched by wet etching. In the second etching process, the semiconductor body 210 is selectively etched to leave the memory film 220 and the core layer 230 in the columnar portion CL.

A lithography process is not performed between the first etching process and the second etching process, and a mask is not changed. Accordingly, in the first and second etching processes, the slits SHE_2 and SHE_CL are formed in a self-aligned manner by changing the etching method.

As illustrated in FIG. 6, in the columnar portion CL overlapping the slit SHE_CL, even though the memory film 220 and the core layer 230 are etched to some extent, the memory film 220 and the core layer 230 protrude from the semiconductor body 210 upward in the stacking direction (Z direction). In other words, an upper end Et_220 of the memory film 220 in the slit SHE_CL and an upper end Et 230 of the core layer 230 are located above an upper end Et 210 of the semiconductor body 210 in the slit SHE_CL. Therefore, in the columnar portion CL in the slit SHE_CL, an insulating film 50 is embedded between the memory film 220 and the core layer 230. The insulating film 50 is provided around the core layer 230 and thereon. That is, the upper portion of the semiconductor body 210 in the slit SHE_CL is replaced with the insulating film 50. Accordingly, even though the semiconductor body 210 is connected to the conductive film 12 and the semiconductor portion 13 which function as a source layer, it is possible to prevent charges from entering the semiconductor body 210 in the slit SHE during a read operation.

In the columnar portion CL overlapping the slit SHE_CL, the upper end Et_220 of the memory film 220 and the upper end Et 230 of the core layer 230 are located above a bottom portion Eb_2 of the slit SHE_2 of the stacked body 2. On the other hand, the upper end Et 210 of the semiconductor body 210 in the slit SHE_CL is at a location deeper (below) than the bottom portion Eb_2 of the slit SHE_2 provided in the stacked body 2. That is, in at least one embodiment, the slits SHE_2 and SHE_CL become deeper in the order of the area of the memory film 220, the area of the core layer 230, the area of the stacked body 2, and the area of the semiconductor body 210.

As illustrated in FIG. 6, the slits SHE_2 and SHE_CL are continuously provided as an integrated slit SHE in the X direction. Therefore, the same insulating film 50 is filled in the slits SHE_2 and SHE_CL. That is, the insulating film 50 in the columnar portion CL in FIG. 5 is the same material as that of the insulating film 50 in the slit SHE, as can be seen with reference to FIG. 6. For example, an insulating film such as a silicon oxide film is used for the insulating film 50.

As described above, in at least one embodiment, the process of forming the slit SHE is divided into two processes including the process of etching the stacked body 2 and the process of etching the columnar portion CL, and the slit SHE_2 and the slit SHE_CL are etched by different etching methods. Therefore, it becomes easy to perform etching control of the slit SHE_2 and the slit SHE_CL. For example, it becomes easy to control the depth of each of the slit SHE_2 and the slit SHE_CL. As a result, excessively deep etching of the slit SHE_2 or the slit SHE_CL is prevented. Accordingly, it is possible not only to cause an opening width of the slit SHE to be narrow, but also to reduce the layout area of the slit SHE. Since the slit SHE_2 or the slit SHE_CL does not become excessively deep, the number of layers of the dummy word lines can also be reduced. As a result, it is possible to achieve the miniaturization of the memory cell array 2m.

Although not illustrated, the slit SHE may not be completely embedded by the insulating film 50. That is, a cavity (void) may be provided in the slit SHE.

FIGS. 7 to 20 are cross-sectional views illustrating an example of a manufacturing method of the semiconductor storage device according to the first embodiment. FIGS. 7 to 20 correspond to the cross section taken along line 7-7 of FIG. 3.

Figure 7:
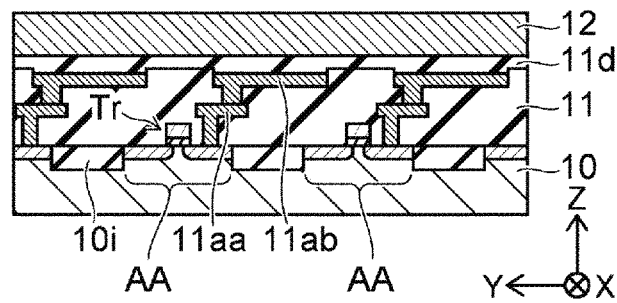
FIG. 7 is a cross-sectional view illustrating an example of a manufacturing method of the semiconductor storage device according to the first embodiment.

As illustrated in FIG. 7, the element isolation area 10*i* is formed in the substrate 10, and the transistor Tr is formed in the active area AA. Next, the insulating film 11 is formed on the substrate 10. The insulating film 11 may be, for example, an interlayer insulating film and includes the wiring 11*a*. The wiring 11*a* is, for example, a multilayer wiring, and in FIG. 7, a wiring 11*aa* and a wiring 11*ab* provided above the wiring 11*aa* are illustrated. Next, an insulating film 11*d* is formed on the wiring 11*ab*. The insulating film 11*d* contains, for example, a silicon oxide. Next, the conductive film 12 is formed on the insulating film 11*d*.

Figure 8:
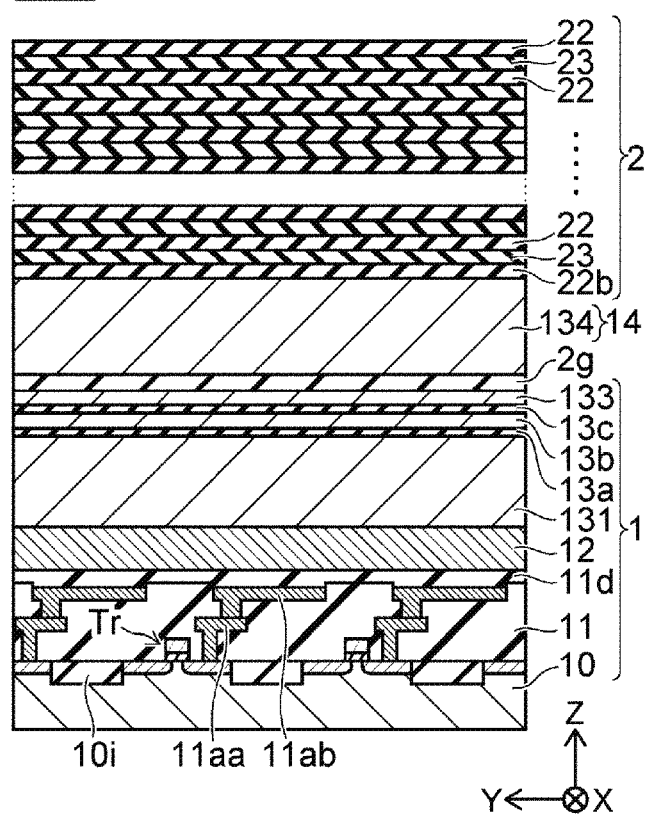
FIG. 8 is a cross-sectional view illustrating an example of the manufacturing method of the semiconductor storage device, following FIG. 7 according to at least one embodiment.

Next, as illustrated in FIG. 8, the semiconductor layer 131 is formed on the conductive film 12. The semiconductor layer 131 contains, for example, n-type doped silicon. The conductive film 12 and the semiconductor portion 13 may be integrated semiconductor portions 12 and 13. Next, an intermediate film 13*a* is formed on the semiconductor layer 131. The intermediate film 13*a* contains, for example, a silicon oxide. Next, a sacrificial film 13*b* is formed on the intermediate film 13*a*. The sacrificial film 13*b* contains, for example, n-type doped silicon or undoped silicon. Next, the intermediate film 13*c* is formed on the sacrificial film 13*b*. The intermediate film 13*c* contains, for example, a silicon oxide. Next, the semiconductor layer 133 is formed on the intermediate film 13*c*. The semiconductor layer 133 contains, for example, n-type doped silicon or undoped silicon. Accordingly, for example, a basic structure of the base body portion 1 during the manufacturing can be obtained.

Next, the insulating film 2*g* is formed on the semiconductor layer 133 and the insulating film 32. The insulating film 2*g* contains, for example, a silicon oxide or a metal oxide. Next, the semiconductor layer 134 is formed on the insulating film 2*g*. The semiconductor layer 134 contains, for example, n-type doped silicon. As described above, the semiconductor portion 14 is formed. Next, the insulating layer 22*b* is formed on the semiconductor layer 134. Continuously, the sacrificial film 23 and the insulating layer 22 are alternately stacked on the insulating layer 22*b*. Each of the insulating layers 22 and 22*b* contains, for example, a silicon oxide. The sacrificial film 23 contains, for example, a silicon nitride. Accordingly, it is possible to obtain a basic structure of the stacked body 2 during manufacturing which is located in the Z direction with respect to the semiconductor portion 13.

Next, although not illustrated, the insulating layer 22 and the sacrificial film 23 are processed into a staircase shape, thereby forming the staircase area (Staircase). The columnar portion CLHR is formed.

Figure 9:
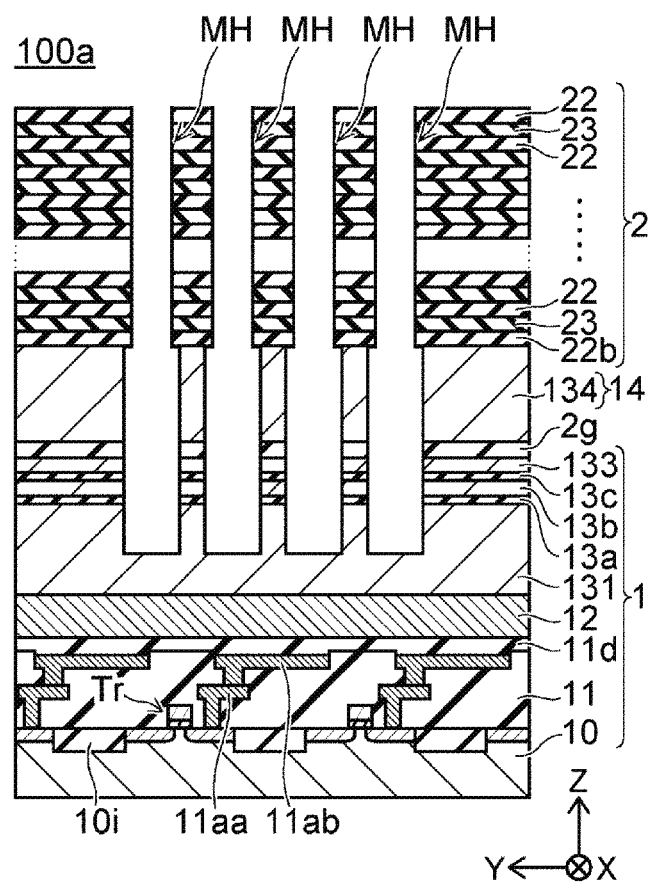
FIG. 9 is a cross-sectional view illustrating an example of the manufacturing method of the semiconductor storage device, following FIG. 8 according to at least one embodiment.

Next, as illustrated in FIG. 9, in the cell area (Cell), the stacked body 2, the semiconductor layer 134, the insulating film 2*g*, the semiconductor layer 133, the intermediate film 13*c*, the sacrificial film 13*b*, the intermediate film 13*a*, and the semiconductor layer 131 are subjected to anisotropic etching, thereby forming the memory hole MH. The memory hole MH is formed from the upper end of the stacked body 2 to the middle of the semiconductor layer 131. The semiconductor layer 134, the insulating film 2*g*, the semiconductor layer 133, the intermediate film 13*c*, the sacrificial film 13*b*, the intermediate film 13*a*, and the semiconductor layer 131 are subjected to the anisotropic etching via the memory hole MH, and at a portion corresponding to the semiconductor portion 13 (for example, the semiconductor layer 131, the sacrificial film 13*b*, and the semiconductor layer 133) and a portion corresponding to the semiconductor portion 14 (for example, the semiconductor layer 134), a diameter of the memory hole MH may be expanded.

Figure 10:
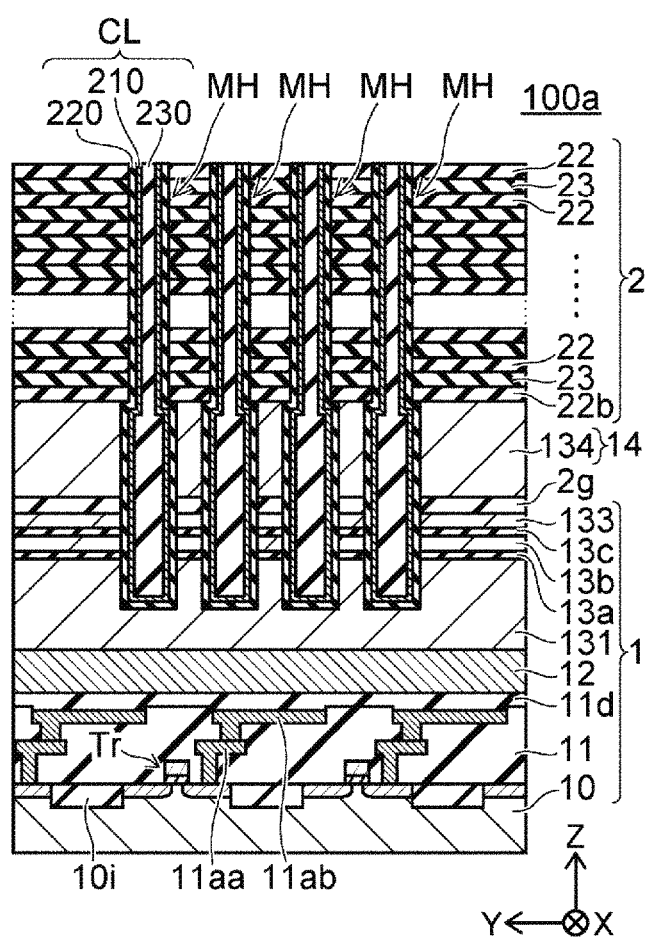
FIG. 10 is a cross-sectional view illustrating an example of the manufacturing method of the semiconductor storage device, following FIG. 9 according to at least one embodiment.

Next, as illustrated in FIG. 10, the memory film 220 is formed in the memory hole MH. The memory film 220 contains a silicon nitride and a silicon oxide. Next, the semiconductor body 210 is formed on the memory film 220. The semiconductor body 210 contains, for example, undoped silicon or p-type doped silicon. Next, the core layer 230 is formed on the semiconductor body 210. The core layer 230 contains, for example, a silicon oxide. Accordingly, the memory hole MH is embedded by the semiconductor body 210, the memory film 220, and the core layer 230.

Figure 11:
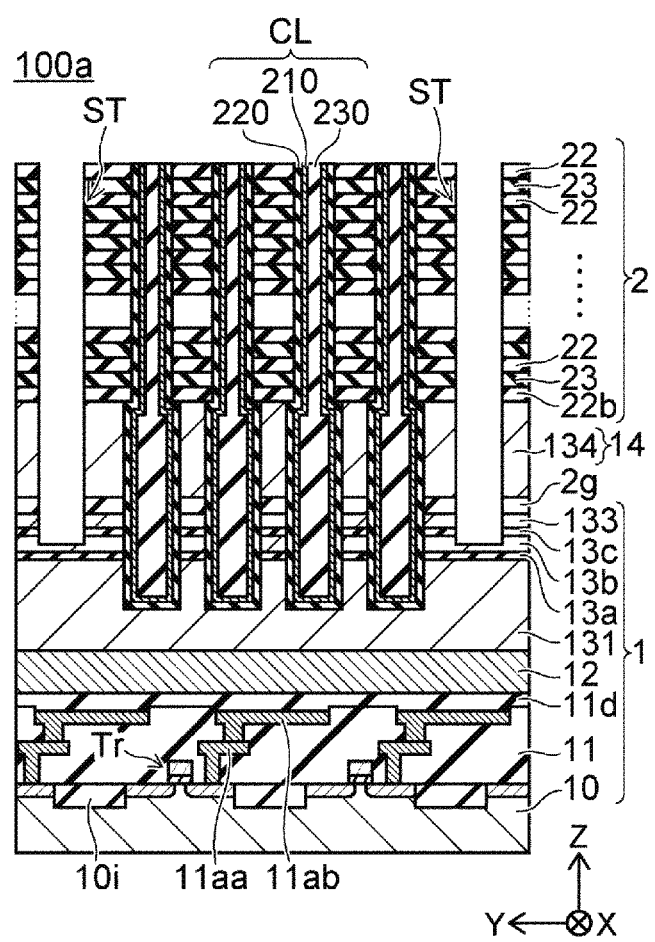
FIG. 11 is a cross-sectional view illustrating an example of the manufacturing method of the semiconductor storage device, following FIG. 10 according to at least one embodiment.

Next, as illustrated in FIG. 11, the stacked body 2, the semiconductor layer 134, the insulating film 2*g*, the semiconductor layer 133, the intermediate film 13*c*, and the sacrificial film 13*b* are subjected to the anisotropic etching, thereby forming the deep slit ST. The deep slit ST is formed from the upper end of the stacked body 2 to the middle of the sacrificial film 13*b*.

Figure 12:
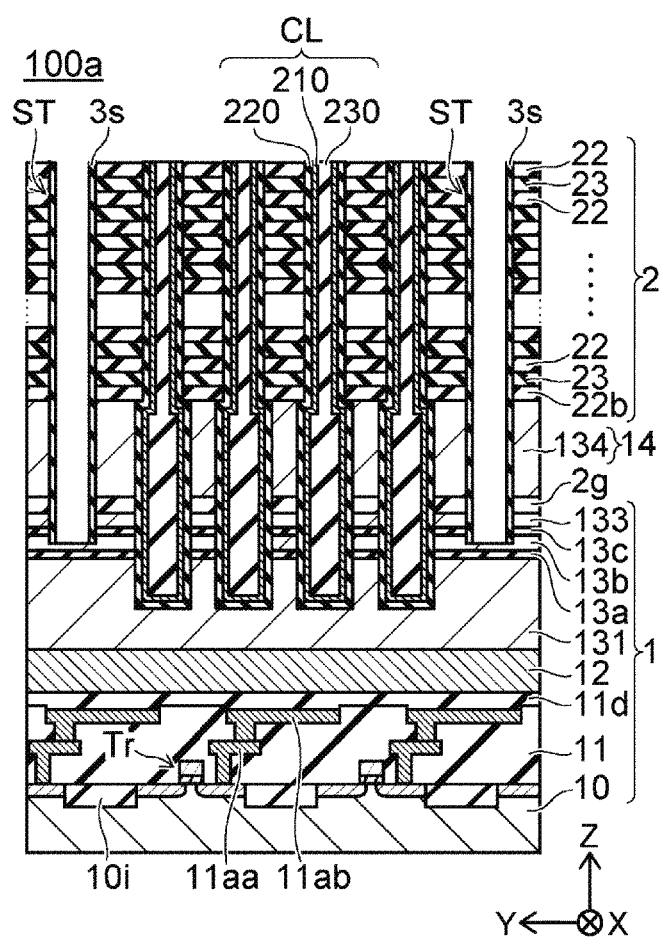
FIG. 12 is a cross-sectional view illustrating an example of the manufacturing method of the semiconductor storage device, following FIG. 11 according to at least one embodiment.

Next, as illustrated in FIG. 12, a stopper film 3*s* is formed on the side wall of the deep slit ST. The stopper film 3*s* contains, for example, a silicon nitride.

Figure 13:
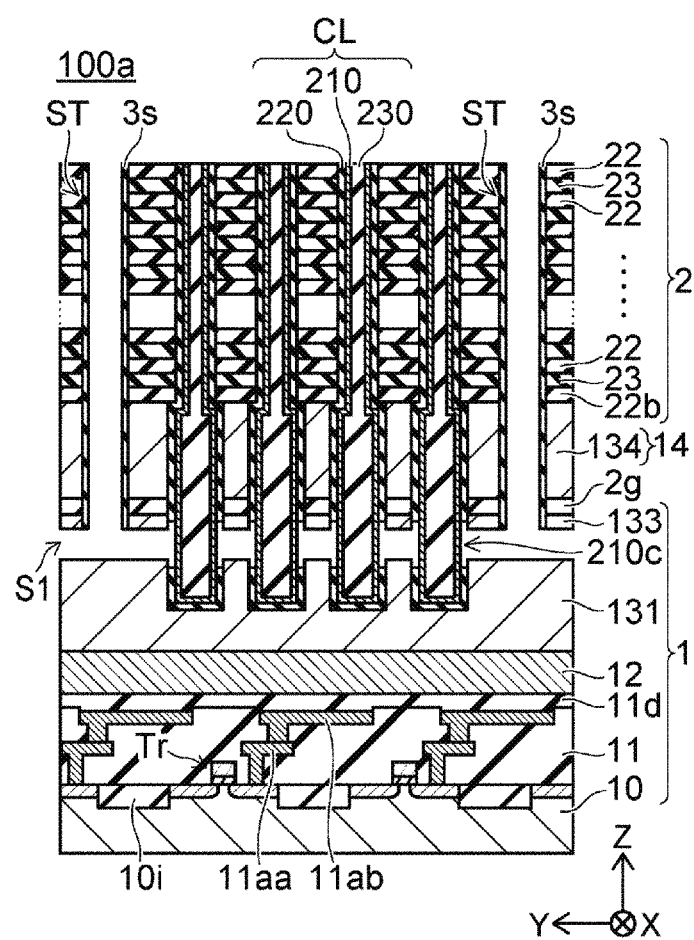
FIG. 13 is a cross-sectional view illustrating an example of the manufacturing method of the semiconductor storage device, following FIG. 12.

Next, as illustrated in FIG. 13, the sacrificial film 13*b* is subjected to isotropic etching via the deep slit ST, thereby removing the sacrificial film 13*b*. In this isotropic etching process, for example, in comparison with a silicon oxide and a silicon nitride, an etchant capable of etching n-type doped silicon or undoped silicon far faster is selected. Accordingly, a space S1 is formed between the intermediate film 13*a* and the intermediate film 13*c*. The cover insulating film 221 of the memory film 220 (FIGS. 2A and 2B) is subjected to the isotropic etching via the deep slit ST, thereby removing the cover insulating film 221. In this isotropic etching process, for example, in comparison with a silicon nitride, an etchant capable of etching a silicon oxide far faster is selected. Next, the charge trapping film 222 of the memory film 220 (FIGS. 2A and 2B) is subjected to the isotropic etching via the deep slit ST, thereby removing the charge trapping film 222. In this isotropic etching process, for example, in comparison with a silicon oxide, an etchant capable of etching a silicon nitride far faster is selected. Next, the tunnel insulating film 223 of the memory film 220 (FIGS. 2A and 2B) is removed via the deep slit ST. In this process, the intermediate films 13*a* and 13*c* are also removed. In this isotropic etching process, for example, in comparison with a silicon nitride, an etchant capable of etching a silicon oxide far faster is selected. Accordingly, the space S1 is expanded between the semiconductor layer 131 and the semiconductor layer 133, and the semiconductor body 210 is exposed to the space S1 in the columnar portion CL. A portion where the semiconductor body 210 is exposed becomes a contact portion 210*c*.

Figure 14:
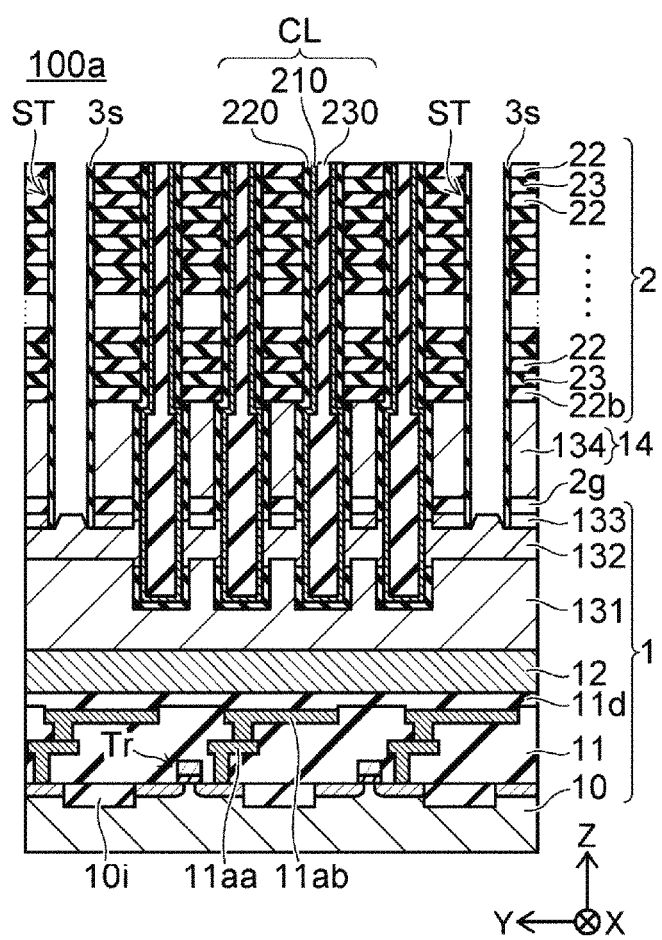
FIG. 14 is a cross-sectional view illustrating an example of the manufacturing method of the semiconductor storage device, following FIG. 13 according to at least one embodiment.

Next, as illustrated in FIG. 14, the semiconductor layer 132 is formed by embedding the inside of the space S1 with the semiconductor via the deep slit ST. The semiconductor layer 132 is, for example, n-type doped silicon.

Figure 15:
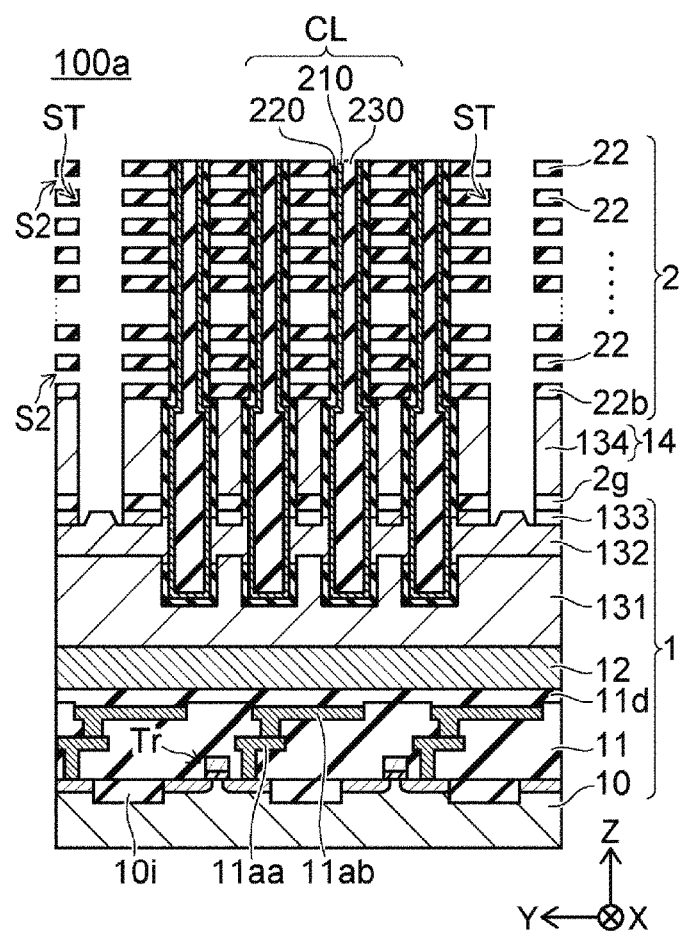
FIG. 15 is a cross-sectional view illustrating an example of the manufacturing method of the semiconductor storage device, following FIG. 14 according to at least one embodiment.

Next, as illustrated in FIG. 15, the stopper film 3*s* and the sacrificial film 23 are subjected to the isotropic etching via the deep slit ST, thereby removing the stopper film 3*s* and the sacrificial film 23. Accordingly, a space S2 is formed between the insulating layers 22. In this isotropic etching process, for example, in comparison with a silicon oxide and polysilicon, an etchant capable of etching a silicon nitride far faster is selected.

Figure 16:
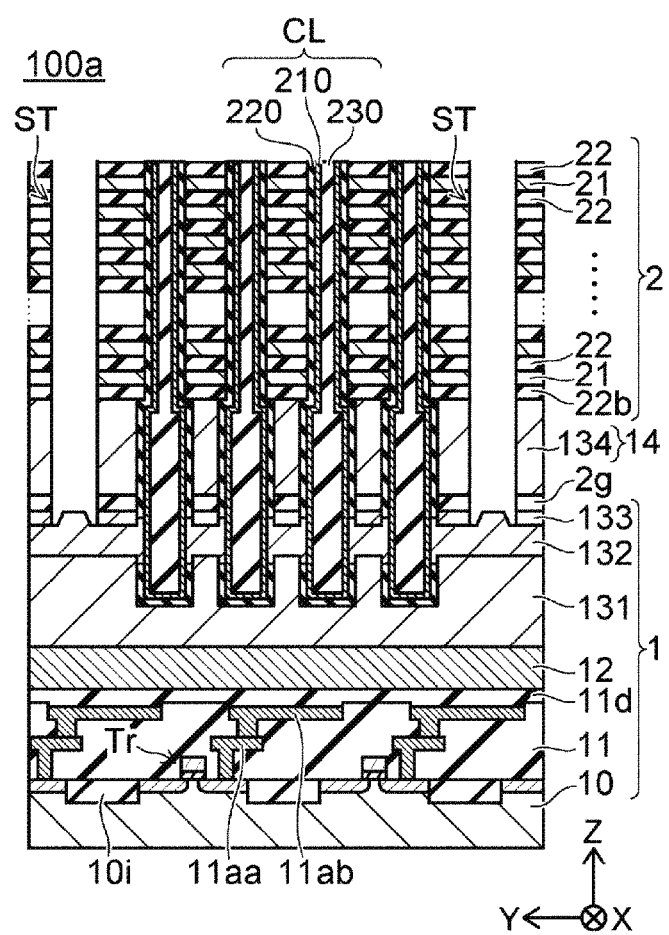
FIG. 16 is a cross-sectional view illustrating an example of the manufacturing method of the semiconductor storage device, following FIG. 15 according to at least one embodiment.

Next, as illustrated in FIG. 16, the inside of the space S2 is embedded with a conductive material via the deep slit ST, thereby forming the conductive layer 21. The conductive layer 21 contains, for example, tungsten.

Figure 17:
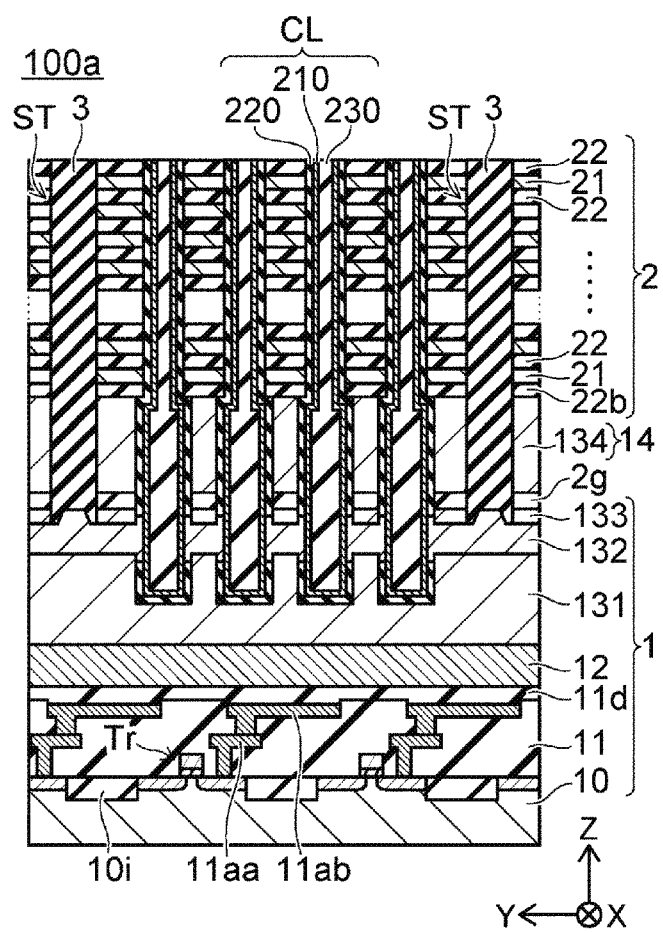
FIG. 17 is a cross-sectional view illustrating an example of the manufacturing method of the semiconductor storage device, following FIG. 16 according to at least one embodiment.

Next, as illustrated in FIG. 17, the deep slit ST is embedded with an insulator, thereby forming the plate-shaped portion 3. The plate-shaped portion 3 contains, for example, a silicon oxide.

Figure 18:
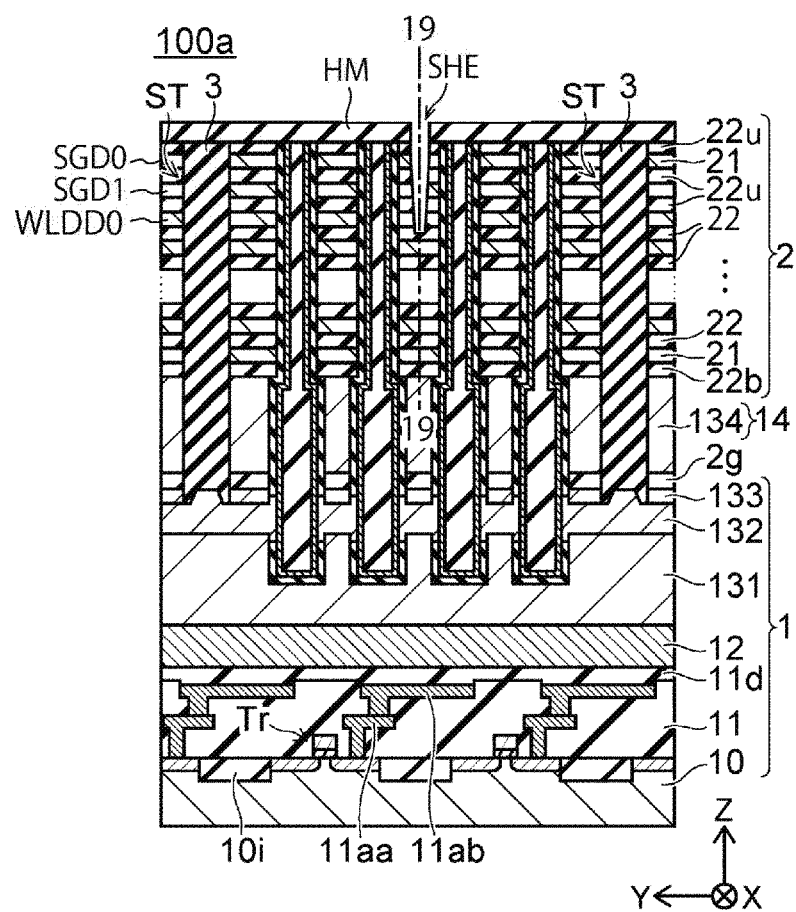
FIG. 18 is a cross-sectional view illustrating an example of the manufacturing method of the semiconductor storage device, following FIG. 17 according to at least one embodiment.

Next, as illustrated in FIG. 18, after the insulating film is deposited, in order to form the shallow slit SHE, the conductive layer 21 corresponding to the upper conductive layers at the upper portion of the stacked body 2 (SGD0, SGD1, and WLDD0 in FIG. 5) and the insulating layer 22 are etched in the stacking direction (Z direction) of the stacked body 2. The slit SHE is formed so as to penetrate, for example, the upper conductive layers SGD0 and SGD1, and the dummy word line WLDD0 in FIG. 5. At this time, since the conductive layer 21 formed of a metal material such as tungsten as well as the insulating layer 22 is etched, as illustrated in FIG. 18, the slit SHE has a taper so that its width becomes narrower as getting closer to the bottom portion.

Here, the process of forming the slit SHE will be described in more detail.

Figure 19:
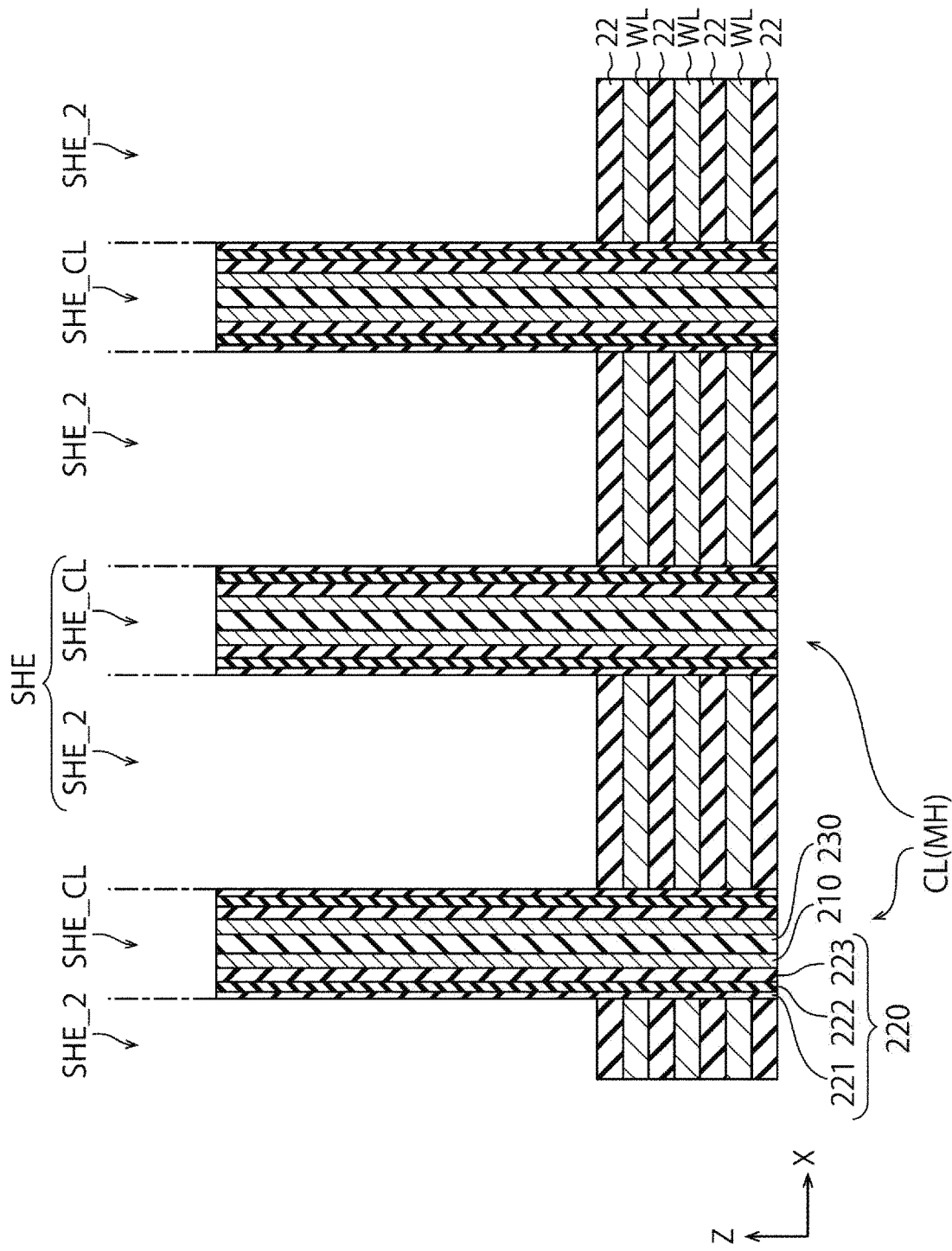
FIG. 19 is a cross-sectional view illustrating an example of the manufacturing method of the semiconductor storage device, following FIG. 18 according to at least one embodiment.
Figure 20:
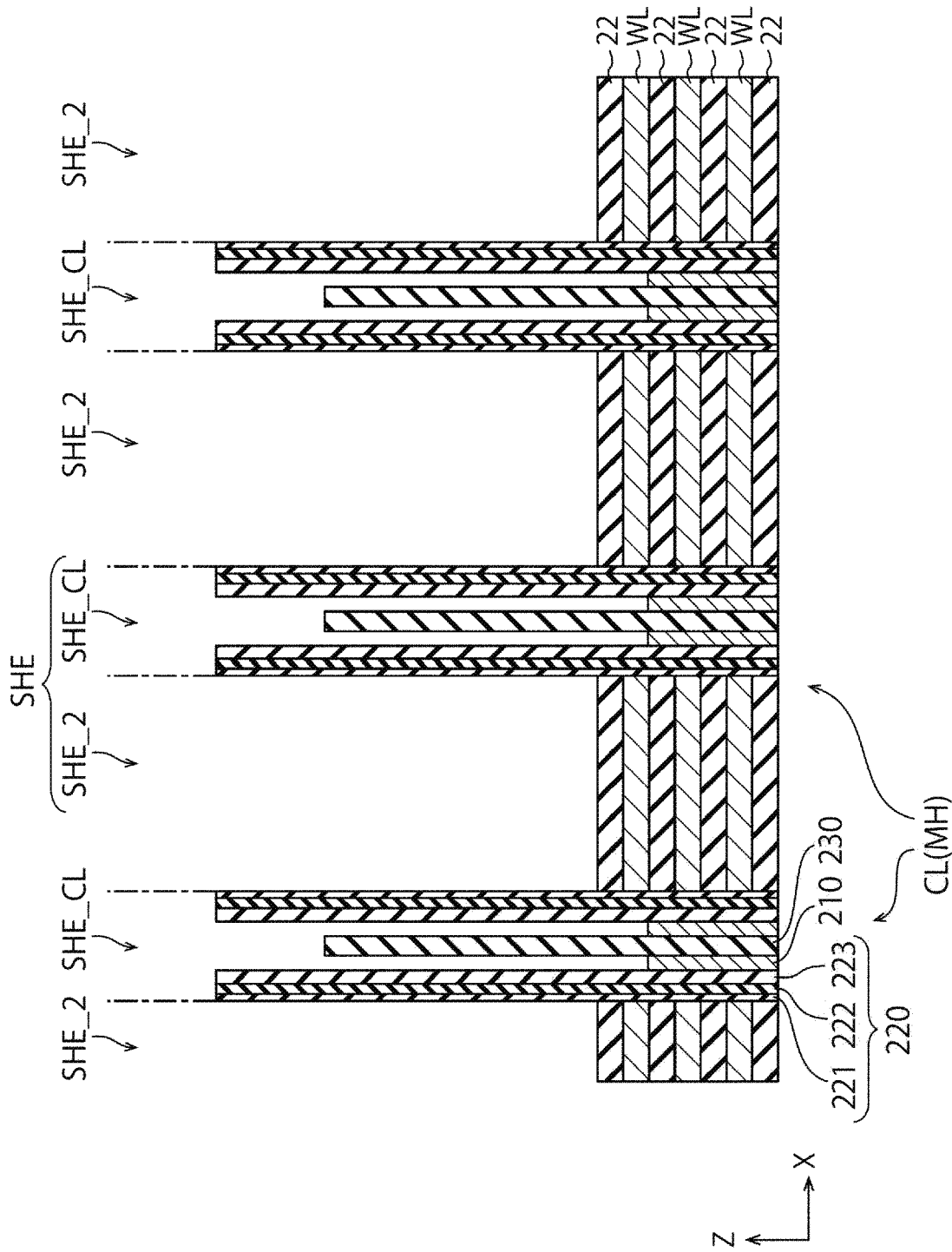
FIG. 20 is a cross-sectional view illustrating an example of the manufacturing method of the semiconductor storage device, following FIG. 19 according to at least one embodiment.

FIGS. 19 and 20 are cross-sectional views illustrating the process of forming the slit SHE in more detail. FIGS. 19 and 20 illustrate a cross section corresponding to FIG. 6, and correspond to a cross section taken along line 19-19 of FIG. 18.

First, an area other than the slit SHE is coated with a resist (not illustrated) by using a lithography technique, and the resist is formed into a pattern of the slit SHE. Next, a hard mask HM is patterned by using the resist as a mask.

Next, as illustrated in FIG. 19, the upper conductive layers (SGD0, SGD14, and WLDD0) at the upper portion of the stacked body 2 are subjected to the anisotropic etching by the RIE method by using the hard mask HM as a mask, thereby forming a groove TR_2 of the slit SHE_2 (the first etching process). At this time, for example, a mixed gas of chlorine and fluorine is used as an etching gas. For example, the upper conductive layer (for example, tungsten) is etched with a high mixing ratio of a chlorine-based gas, and the insulating layer 22 (for example, the silicon oxide film) is etched with a high mixing ratio of a fluorine-based gas. Accordingly, the upper conductive layers and the insulating layer 22 therebetween can be selectively etched. The semiconductor body 210 (for example, polysilicon) is slightly etched during the process of the slit SHE_2, but remains up to a location higher than the bottom of the slit SHE_2. That is, in at least one embodiment, a gas that etches both the stacked body 2 and the columnar portion CL (for example, only the chlorine-based gas) is not used, but a gas that selectively etches the stacked body 2 (for example, a chlorine-based and fluorine-based mixed gas) is used. Accordingly, the groove TR_2 of the slit SHE_2 is deeply formed as illustrated in FIG. 19, and the groove TR_CL of the slit SHE_CL is shallowly formed up to the semiconductor body 210.

Next, as illustrated in FIG. 20, the semiconductor body 210 in the columnar portion CL is subjected to the isotropic etching by a wet etching method by using the same hard mask HM as a mask (the second etching process). Accordingly, the groove TR_CL of the slit SHE_CL is selectively and deeply etched at the portion of the semiconductor body 210. Conversely, the core layer 230 and the memory film 220 are not etched much and protrude from the semiconductor body 210 in the Z direction. For example, diluted hydrofluoric acid (DHF) and trimethyl-2-hydroxyethylammonium hydroxide (TMY) are used as an etching liquid. The semiconductor body 210 (for example, polysilicon) can be selectively etched by this etching liquid.

The semiconductor body 210 is etched to the same degree as the bottom of the slit SHE_2, or etched from the slit SHE_2 to the depth of the word line WL therebelow.

The first and second etching processes are performed by using the same mask. That is, after the hard mask HM exposing both the slits SHE_2 and SHE_CL is formed, the first and second etching processes are continuously performed without changing the hard mask HM. In the first etching process, the anisotropic etching is performed by the RIE method, but the stacked body 2 is selectively etched by the etching gas. In the second etching process, the semiconductor body 210 is selectively subjected to the isotropic etching by the wet etching. Accordingly, in the first and second etching processes, the stacked body 2 or the semiconductor body 210 can be etched with good controllability even though the same mask is used. The slit SHE can be formed in a self-aligned manner with little fluctuation.

Next, the insulating film 50 is embedded in the grooves TR_CL and TR_2. Accordingly, as illustrated in FIG. 6, the slits SHE_CL and SHE_2 are formed.

Thereafter, although not illustrated, an interlayer insulating film, a contact plug, and a bit line BL are formed above the stacked body 2 according to a well-known method. Accordingly, the semiconductor storage device 100a illustrated in FIG. 1A is completed.

In this manner, according to at least one embodiment, the process of forming the slit SHE is divided into two processes including the first etching process of the stacked body 2 and the second etching process of the columnar portion CL, and the slit SHE_2 and the slit SHE_CL are formed by different etching methods while using the same mask.

Accordingly, the etching control of each of the slit SHE_2 and the slit SHE_CL becomes easy. As a result, the slit SHE_2 or the slit SHE_CL is not excessively deeply etched. What is described above makes it possible not only to cause the opening width of the slit SHE to be narrow, but also to reduce the layout area of the slit SHE. Since the slit SHE_2 or the slit SHE_CL does not become excessively deep, the number of layers of the dummy word lines can be reduced. As a result, the miniaturization of the memory cell array 2m can be achieved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a substrate;
   a stacked body disposed above the substrate and having a plurality of first insulating layers and a plurality of conductive layers which are alternately stacked;
   a plurality of columnar portions penetrating the stacked body and including:
     a core layer disposed at a center portion of the columnar portions,
     a semiconductor layer disposed around the core layer, and
     a memory film provided around the semiconductor layer; and a slit that divides an upper conductive layer at an upper portion of the stacked body, wherein in a columnar portion overlapping the slit, the core layer or the memory film protrudes from the semiconductor layer, wherein in the columnar portion overlapping the slit, an upper end of the core layer or the memory film is located above a bottom portion of the slit which is disposed in the stacked body.

2. The semiconductor storage device according to claim 1, wherein an upper end of the semiconductor layer in the columnar portion overlapping the slit is located below the bottom portion of the slit that is disposed in the stacked body.

3. The semiconductor storage device according to claim 1, further comprising:

a second insulating layer disposed between the core layer and the memory film in the columnar portion overlapping the slit.

4. The semiconductor storage device according to claim 1, wherein the memory film is cylindrical.

5. The semiconductor storage device according to claim 1, further comprising an insulator disposed in the slit.

6. The semiconductor storage device according to claim 1, wherein the columnar portions are arranged in a packed manner.

7. The semiconductor storage device according to claim 1, further comprising a barrier film arranged between the plurality of first insulating layers and the plurality of conducting layers.

* * * * *